United States Patent [19]

Peled et al.

[11] Patent Number: 4,725,784

[45] Date of Patent: Feb. 16, 1988

[54] METHOD AND APPARATUS FOR DETERMINING THE STATE-OF-CHARGE OF BATTERIES PARTICULARLY LITHIUM BATTERIES

[75] Inventors: Emanuel Peled, Even Yehuda; Herzel Yamin, Kiron; Israel Reshef, Givatayim; David Kelrich, Ramat-Hasharon; Shlomo Rozen, Herzliya, all of Israel

[73] Assignee: Ramot University Authority for Applied Research & Industrial Development Ltd., Tel Aviv, Israel

[21] Appl. No.: 648,943

[22] Filed: Sep. 10, 1984

[30] Foreign Application Priority Data

Sep. 16, 1983 [IL] Israel .................................. 69750

[51] Int. Cl.$^4$ ............................................. G01N 27/46
[52] U.S. Cl. ..................................... 324/427; 320/48; 340/636
[58] Field of Search ...................... 324/427, 426, 429; 340/636, 635; 320/35, 36, 48

[56] References Cited

U.S. PATENT DOCUMENTS

| | | | |
|---|---|---|---|
| 4,194,146 | 3/1980 | Patry et al. | 320/48 X |
| 4,377,787 | 3/1983 | Kikwoka et al. | 324/427 X |
| 4,460,870 | 7/1984 | Tinger | 324/429 |
| 4,558,281 | 12/1985 | Codd et al. | 324/427 |

Primary Examiner—Reinhard J. Eisenzopf
Assistant Examiner—Robert W. Mueller
Attorney, Agent, or Firm—Benjamin J. Barish

[57] ABSTRACT

Method and apparatus for determining the state-of-charge of batteries, particularly lithium batteries, involves the steps of: (a) measuring the temperature of the battery; (b) loading the battery to produce a high discharge for a short period of time; (c) after a short rest period, measuring the open-circuit-voltage of the battery; and (d) determining from the measured temperature and open-circuit-voltage the residual state-of-charge of the battery. Preferably, the residual state-of-charge of the battery is determined by comparing the measured temperature and open-circuit-voltage with reference tables showing the state-of-charge at different temperatures and open-circuit-voltages for the respective battery.

26 Claims, 8 Drawing Figures

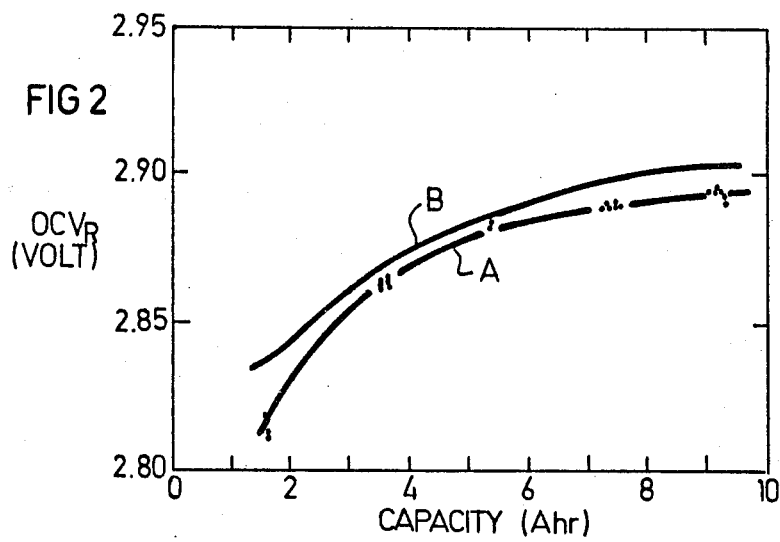
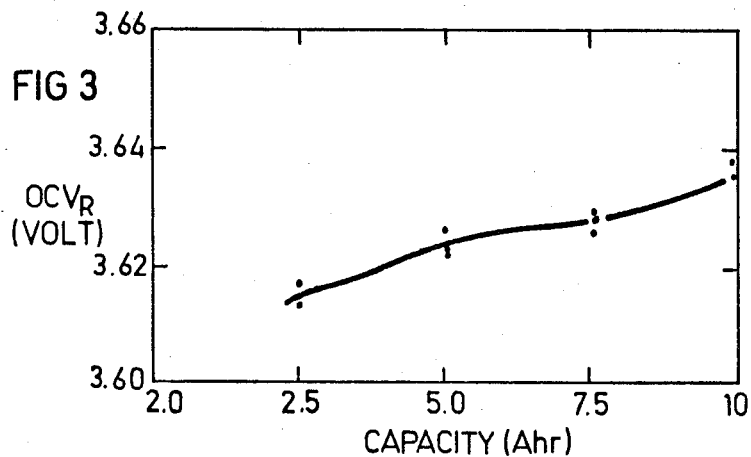
```
                STATE OF CHARGE METER
TEST        ⊗ Q > 70%
  ○         ⊗ Q = 60%                              ⊗on
            ⊗ Q = 50%              ⊗ Failure      • POWER
  ⊗         ⊗ Q = 40%      PCI       (OCV)          off
            ⊗ Q = 30%       •
            ⊗ Q = 20%     Mallory
            ⊗ Q < 10%             ⊗ Failure
                                    (load)
```
FIG 7

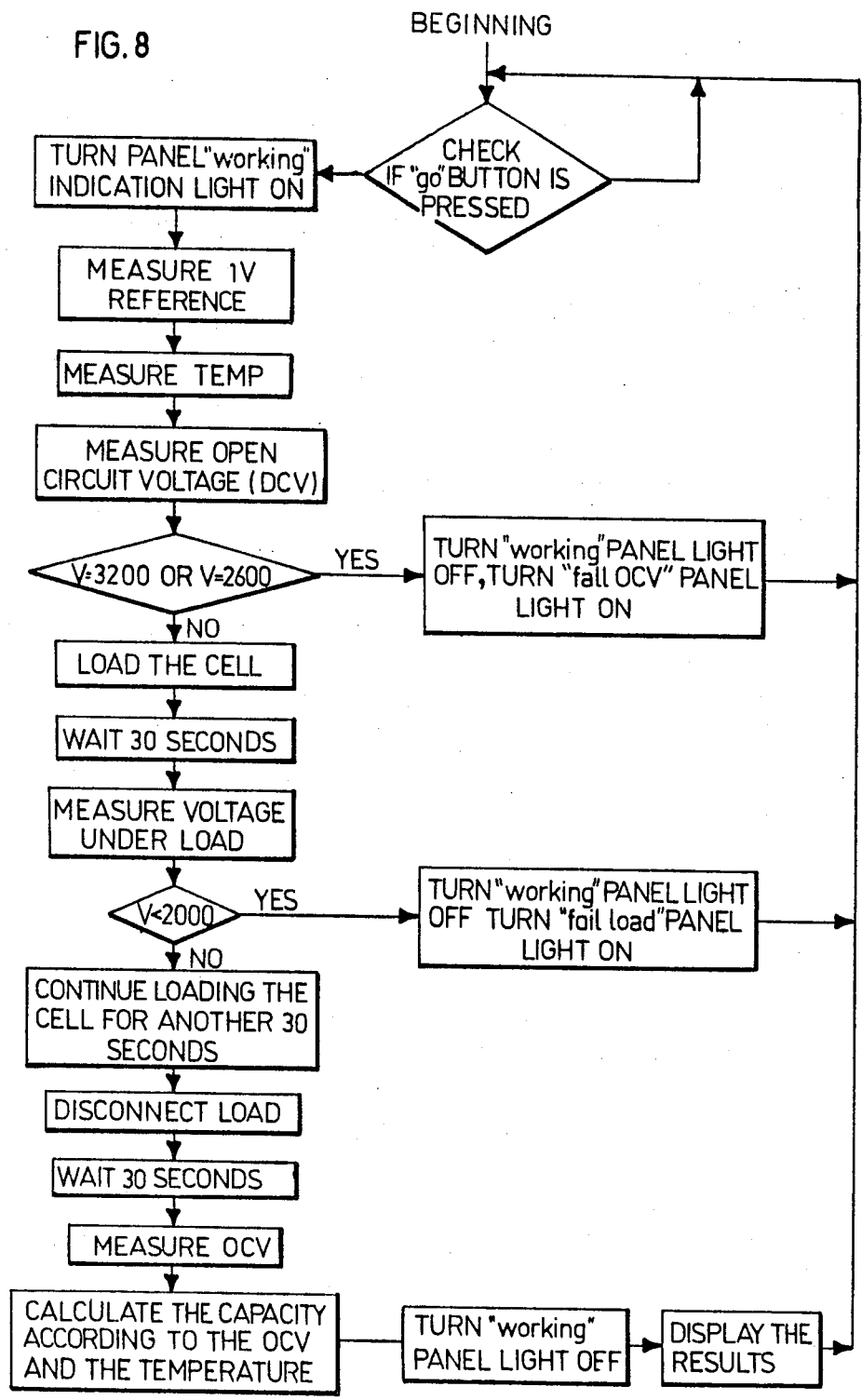

METHOD AND APPARATUS FOR DETERMINING THE STATE-OF-CHARGE OF BATTERIES PARTICULARLY LITHIUM BATTERIES

BACKGROUND OF THE INVENTION

The present invention relates to a method and apparatus for determining the state-of-charge of batteries. The invention is particularly applicable with respect to lithium batteries, such as $Li/SO_2$ and $Li/SOCL_2$ batteries, and is therefore described below with respect to this application, although it will be appreciated that the invention may also be advantageously used for other batteries as well.

It is frequently very important to determine the state-of-charge of a battery, i.e. the residual capacity (ampere-hours) still remaining. However, some batteries, particularly the lithium batteries such as $Li/SO_2$ and $Li/SOCL_2$ batteries, have very constant or flat discharge curves which give no information with respect to the battery state-of-charge. Insofar as we are aware, no practical, non-destructive technique has been devised for measuring the state-of-charge of lithium batteries or other batteries having constant discharge curves. In addition, in the case of $Li/SO_2$ batteries, the open circuit voltage (OCV) is independent of the state of charge in the range of 60-100% capacity. For example, a fully charged 10 Ah $Li/SO_2$ cell has the same OCV (2.993 0.003 V) as that of a 40% discharged cell. Thus, it is impossible to predict the state of charge from the OCV.

An object of the present invention is to provide a novel method, and also novel apparatus, for determining the state-of-charge of batteries, which method and apparatus are particularly useful with respect to lithium batteries or other batteries having very constant discharge curves.

SUMMARY OF THE INVENTION

According to a broad aspect of the present invention, there is provided a method for determining the state of charge (residual capacity) of batteries comprising the steps: (a) measuring the temperature (T) of the battery, (b) loading the battery with a predetermined load to produce a high discharge for a short predetermined time ($t_L$), (c) after a short recovery time ($t_R$), measuring the recovered open-circuit-voltage ($OCV_R$) and the corresponding recovery time of the battery, and (d) determining the state-of-charge of the battery from the measured temperature and measured recovery open-circuit-voltage, from the predetermined load, loading time and recovery time for the particular type of battery. For this purpose there may be used calibration curves preprepared according to the type and size of the battery, temperature (T), load (L), load time ($t_L$), and recovery time ($t_R$). It is possible to select different sets of parameters, within a certain range, but each set of parameters (L, $t_L$, $t_R$) produces a different calibration curve for a predetermined temperature (T).

In the preferred embodiment of the invention described below, the battery is loaded such as it would produce a discharge of nominal capacity in 1-10 hours, about two hours having been found preferred for lithium batteries. In addition, the battery is preferably loaded to produce the high discharge for a period of 1-300 seconds, a period of 10-60 seconds having been found preferred for lithium batteries. The recovery time before measuring the open-circuit-voltage is preferably 1-1000 seconds, a period of 10-60 seconds having been found to be preferable for lithium batteries.

It has been found that loading the batteries to produce the high discharge for the short period of time before measuring the open-circuit-voltage, is effective to remove all or substantially all of a passivating layer which forms on the lithium anode if a substantial period of time has transpired from the last use of the battery. Thus, it was found that when the recovery open-circuit-voltage ($OCV_R$) of the battery is measured without a sufficient pre-loading of the battery to produce the high discharge for the short period of time, this passivating layer on the anode reflects the polarization of the anode, and therefore the subsequently measured recovery open-circuit-voltage has little correlation to the state-of-charge of the battery.

The short recovery time ($t_R$) after the load has been removed, was also found to be very important in order to provide reproducible predictions of state-of-charge. Thus, it was found that when the recovery period is too short, the measured recovery open-circuit-voltage is influenced by the resistive ohmic voltage drop in the solution, and the anodic polarization, which have little correlation with the state-of-charge of the battery. On the other hand, when the recovery period is too long, it was found that the sensitivity of the method decreases. Preferably this recovery period, before the recovery open-circuit-voltage is measured, should be from 1-1000 seconds, a recovery period of 10-60 seconds having been found particularly effective with respect to lithium batteries.

In the preferred embodiment of the invention described below, the state-of-charge of the battery is determined by comparing the measured temperature and recovery open-circuit-voltage with reference tables showing the state-of-charge for different temperatures and recovery open-circuit voltages for the respective battery and for the above-mentioned parameters L, $t_L$, $t_R$. However, it was also found that, with respect to 10 Ah $Li/SO_2$ batteries, a close approximation of the residual charge of the battery may be obtained by computing it from the measured temperature and recovery open-circuit-voltage according to the following equation:

$$\ln Q = 28.05[OCV_R + (T-25) \cdot 0.4 \cdot 10^{-3}] - 79.325$$

wherein:
Q is the residual charge in amp-hours;
ln Q is the natural log of Q;
$OCV_R$ is the measured recovery open-circuit voltage of a single cell, or in the case of a plural-cell battery, the voltage of the battery divided by the number of cells in series, at temperature T;
T is the measured temperature (degrees C.) in the range 0°-50° C.; and wherein: the load is 0.5 ohm, the loading period is 60 seconds, and the recovery period is 30 seconds.

According to a further aspect of the invention, there is provided apparatus for determining the state-of-charge of batteries, particularly lithium batteries, in accordance with the foregoing method. The preferred apparatus described below includes a microprocessor which is programmed to perform the above-described steps of the method.

It will thus be seen that the invention provides a method and apparatus for measuring the state-of-charge of batteries having flat discharge curves, such as lithium batteries, which method is non-destructive, is fast, and does not waste the battery capacity. With respect to the latter advantage, the method consumes a very small fraction, less than 1% of the battery capacity.

Further features and advantages of the invention will be apparent from the description below.

BRIEF DESCRIPTION OF THE DRAWINGS

The invention is herein described by way of example with reference to the accompanying drawings, wherein:

FIG. 2 illustrates two room temperature curves showing the relationship of the residual capacity of a single-cell (A) and a plural-cell Li/SO$_2$ battery (B) as a function of the recovery open-circuit voltage (OCV$_R$) measurements in accordance with the present invention, the OCV$_R$ of the plural-cell battery being obtained by dividing the measurement by the number of cells in series of the battery.

FIG. 3 is a room temperature curve illustrating a similar relationship as in FIG. 2 but with respect to Li/SOCL$_2$ batteries of D-size, when the load was 100 ohm, the load time ($t_L$) was 60 seconds, the recovery time ($t_R$) was 120 seconds, and the temperature (T) was 25° C.;

FIG. 7 illustrates the front panel of a state-of-charge meter in the system of FIG. 5; and FIG. 8 is a flow diagram illustrating the programmed sequence of operations to be performed by the microprocessor in the system of FIG. 5.

DESCRIPTION OF A PREFERRED EMBODIMENT

Figure 1:
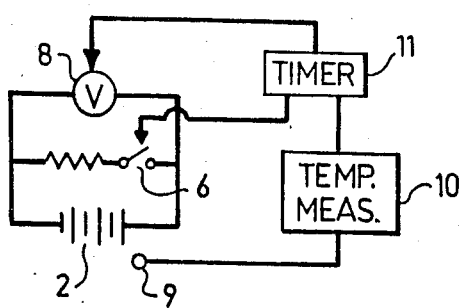
FIG. 1 schematically illustrates a set-up for measuring the state-of-charge of a battery in accordance with the invention.

With reference to FIG. 1, there is illustrated the essential elements for determining the state-of-charge of a battery, therein designated 2, in accordance with the present invention. These elements include a high-power resistor 4 connectable across the battery 2 by means of a switch 6; a voltage-measuring circuit 8 to measure the battery-voltage thereof; a temperature sensor 9 adapted to sense the temperature of the battery 2; a temperature-measuring circuit 10 and a timer circuit 11. In practicing the method by the use of the set-up schematically illustrated in FIG. 1, the temperature of battery 2 under test is first measured by temperature sensor 9 and measuring circuit 10, the measurement being effected while switch 6 is open so that no load is across the battery. Switch 6 is then closed to connect resistor 4 across the battery to produce a predetermined high discharge for a predetermined short period of time; switch 6 is then opened for a predetermined short recovery time; and then the recovery open-circuit-voltage across the battery 2 under test is measured by the voltage-measuring circuit 8. The measurements of the recovery open-circuit-voltage and of the temperature thus obtained may then be used for determining the state-of-charge of the battery 2 under test, for example, by the use of relevant calibration curves.

Thus, it has been found, particularly with respect to lithium batteries, that the state-of-charge, or residual capacity, of the battery bears, for any one temperature, a predictable relationship to the recovery open-circuit-voltage measurement when such measurement has been made after the battery has been loaded to produce a predetermined high discharge for a short period of time followed by a predetermined short recovery time. As described earlier, loading the battery, which is effected by closing switch 6 to connect resistor 4 across the battery, removes the passivating layer on the lithium anode so that the measurement is substantially free of the anodic polarization, and reflects mostly the polarization of the cathode. The recovery time between loading and measuring the recovery open-circuit-voltage has been found important to give reproducible results, since it minimizes the effects of ohmic voltage drop in the solution, and anodic polarization in the recovery open-circuit-voltage, which have little correlation with the state-of-charge of the battery and therefore can affect the accuracy of the results.

Since the measurements of recovery and open-circuit-voltage for a set of defined parameters (L, $t_L$, $t_R$) provide accurate and reproducible indications of the state-of-charge of the battery, reference tables or curves can be prepared for each temperature showing the state-of-charge of the battery for the measured recovery open-circuit-voltage for the respective battery. In the case of Li/SO$_2$ batteries, it has been found that this relationship of state-of-charge to recovery open-circuit-voltage is substantially accurate and reproducible for each temperature within the range of about −40° to +70° C.; therefore, reference or calibration curves can be prepared for each temperature within this range for each set of parameters (L, $t_L$, $t_R$), each set of such parameters resulting in a different calibration curve.

Preferably, resistor 4 (FIG. 1) should be of a value so as to load the battery upon closure of switch 6 such as would produce a discharge of the full nominal capacity of the battery in 1–10 hours. In the case of 10 Ah D-size Li/SO$_2$ batteries, particularly good results have been obtained when resistor 4 has a value of 0.5 ohms multiplied by a number of cells within the battery 2 under test. Thus, if battery 2 is a single-cell battery, resistor 4 preferably has a value of 0.5 ohms; and if the battery is a 5-cell one, resistor 4 preferably has a value of 2.5 ohms. This loading of the battery produces a discharge of the full nominal battery capacity in about two hours.

In this example, switch 6 is closed for a period of 60 seconds to produce the high discharge, following which it is opened; then after the elapse of another period of 30 seconds, the recovery open-circuit voltage is read from the voltmeter 8. As indicated earlier, however, the loading period may generally be from about 1–300 seconds, a period of 10–60 seconds being preferred; and the recovery period may be from 1–1000 seconds, a recovery period of 10–60 seconds, also being preferred.

FIG. 2 illustrates the residual capacity of an Li/SO$_2$ (10 Ah D-size) battery with respect to the recovery open-circuit-voltage (OCV$_R$) measurement taken after loading the battery to produce a high discharge for a short period of time, and a short recovery period thereafter, in accordance with the procedure described above. Curve A represents this relationship with respect to a single-cell battery, wherein the loading resistor 4 in FIG. 1 had a value of 0.5 ohms; and curve B represents the relationship with respect to a 15-volt five-cell battery, wherein resistor 4 had a value of 2.5 ohms (i.e. 0.5·5, the recovery open-circuit voltage being the measured voltage divided by "5"). In both cases, the load was applied for a period ($t_L$) of 60 seconds, following which there was a recovery period ($t_R$) of 30 seconds; and the measurement of the curves A and B were taken at a temperature of 25° C. It will be seen that both curves have substantially the same shape, the small difference resulting from the face that the loading current of the battery was not exactly the same for the five-cell battery (curve B) as for the single-cell battery (curve A) because of a difference in the total resistance of the circuit. Both curves A and B represent the mean of a number of experiments performed with both single-cell batteries and five-cell batteries.

During these experiments, measurements were taken at temperatures of minus 40° C. to 70° C., and it was found that the resulting curves were similar but varying with temperature.

FIG. 3 illustrates the results of experiments conducted with respect to $LI/SOCL_2$ batteries, the curves therein illustrated being for a single-cell D-size battery at 25° C. In this case, the loading resistor was 100 ohms, the loading period was 60 seconds, and the recovery period was 120 seconds.

Figure 4:
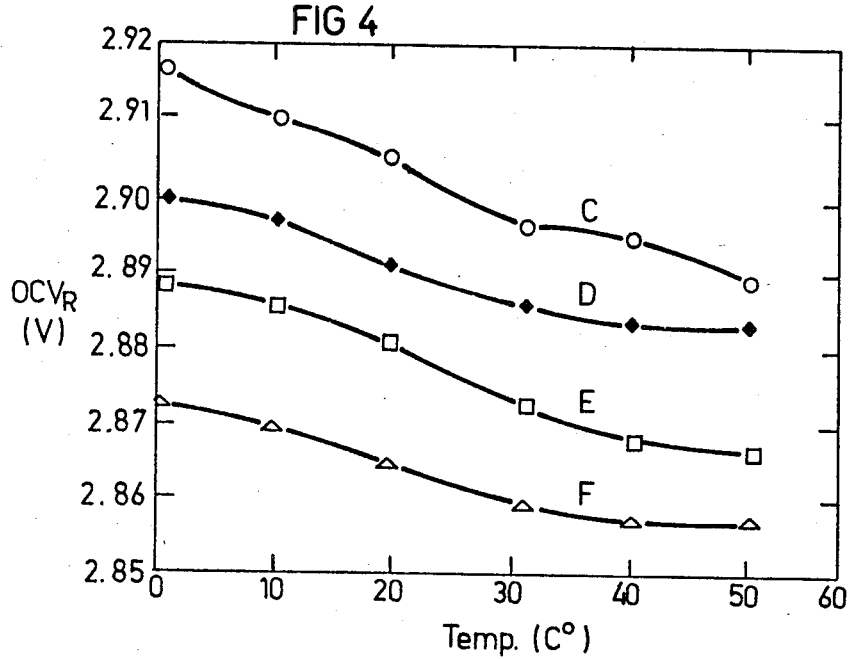
FIG. 4 illustrates the relationship of OCV$_R$ at various room temperatures for different battery residual capacities, of 10 Ah Li-SO$_2$ battery, wherein C=9.4 Ah D=7.1 Ah, E=4.8 Ah, and F=3.0 Ah.

FIG. 4 illustrates the relationship of recovery open-circuit-voltage at various room temperatures for different residual capacities of 9 Ah $LiSO_2$ batteries, namely residual capacity of: 9.4 Ah (curve C), representing a fully-charged battery; 7.1 Ah (curve D); 4.8 Ah (curve E), and 3.0 Ah (curve F). In all these tests, the loading period was 60 seconds, the recovery period was 30 seconds, and loading resistor was 0.5 ohm.

It will thus be seen that tables or curves can be prepared for each type of battery, for each temperature within the range of minus 40° C. to plus 70° C., and for each set of parameters $Lt_L$, $t_R$, which curves can be used as a reference to determine the residual capacity of the respective type of battery when its recovery open-circuit voltage and temperature are measured in accordance with the above-described procedure. Such tables or curves may be stored as look-up tables in apparatus for determining the state-of-charge or residual capacity of the battery by performing the above-described operations and then comparing the measured recovery open-circuit-voltage and temperature with the stored look-up tables.

It has been found, however, that particularly for $Li/SO_2$ batteries, the residual capacity of the battery can also be closely approximated by solving an equation, as set forth below, based on the recovery open-circuit-voltage and temperature measurements produced by following the procedure of the present invention. Thus, it was found that, in the case of $Li/SO_2$ batteries, the residual capacity (Q) of a 9 Ah battery closely approximates the following equation at 25° C. with respect to the recovery open-circuit-voltage ($OCV_R$) as measured in accordance with the above-described procedure ($R_L = 0.5$ ohm, $t_L = 60$ sec, $tR = 50$ sec):

$$\text{Ln } Q = OCV_R \cdot 28.05 - 79.325 \qquad \text{Eq(1)}$$

It was also found that for the temperature range of 0°–50° C., the $OCV_R$-temperature relationship closely follows the following equation:

$$OCV_R = OCV_R(25) - (T-25) \cdot 0.4 \cdot 10^{-3} \qquad \text{Eq(2)}$$

It will therefore be seen that:

$$\ln Q = 28.05[OCV_R + (T-25) \cdot 0.4 \cdot 10^{-3}] - 79.325 \qquad \text{Eq(3)}$$

It will therefore be seen that, particularly when the method is implemented by computer apparatus, a close approximation of the residual capacity can be computed by solving the above Equation (3) from the recovery open-circuit-voltage and temperature measurements obtained in accordance with the above-described procedure.

Figure 5:
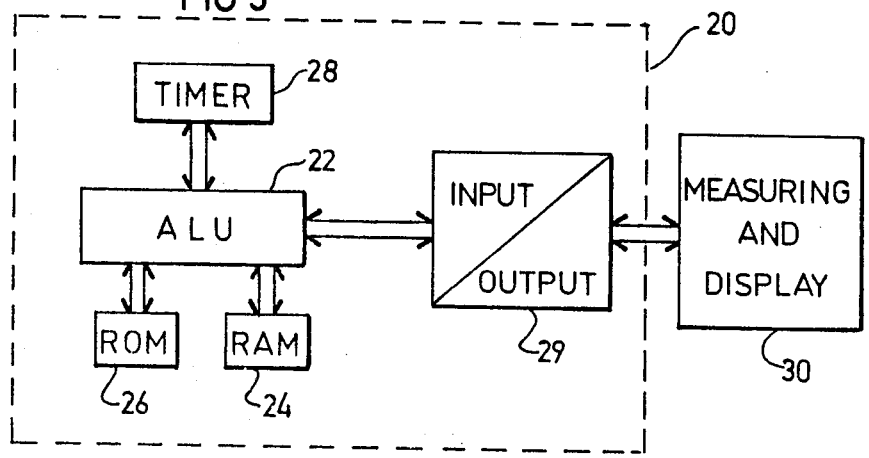
FIG. 5 is a block diagram illustrating one form of apparatus constructed in accordance with the present invention.
Figure 6:
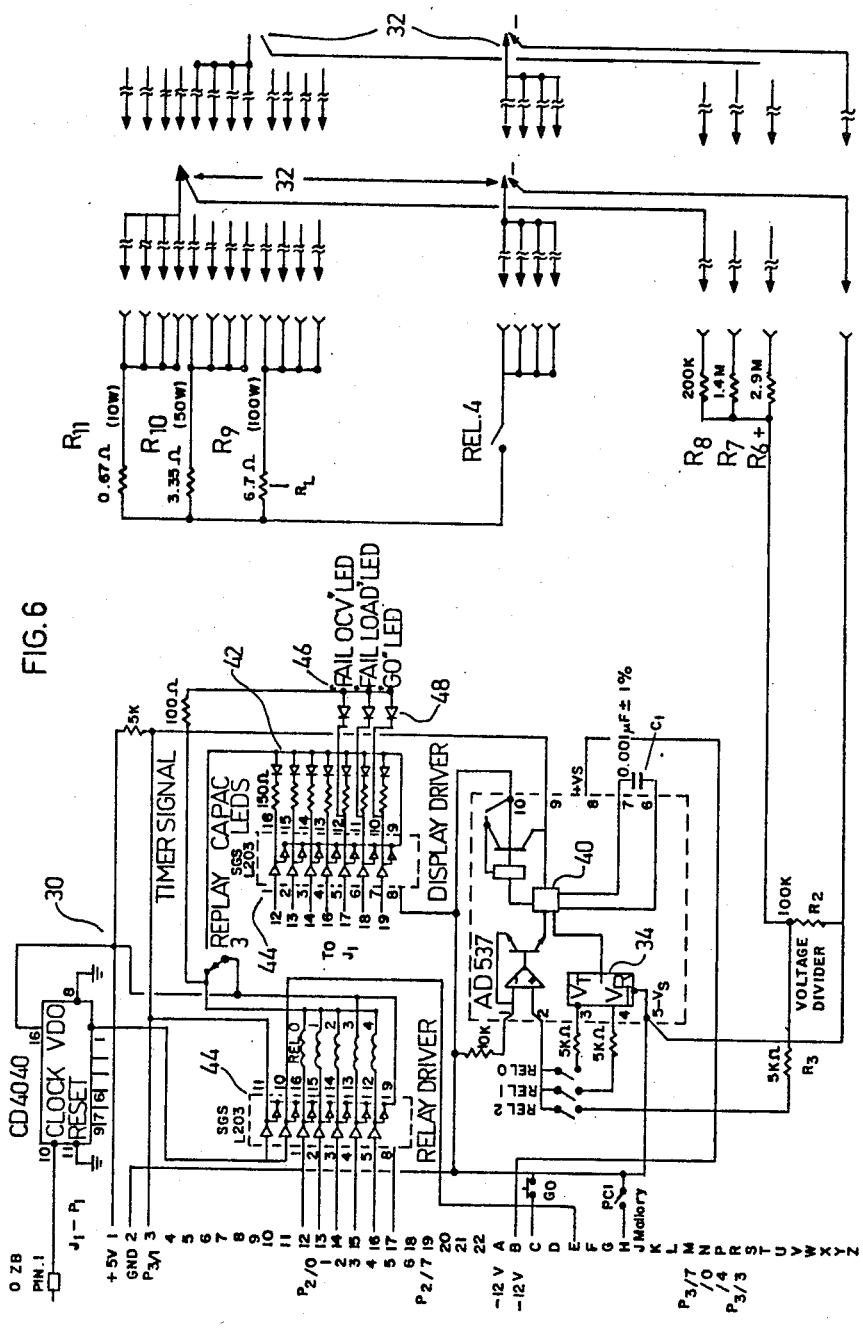
FIG. 6 is a schematic diagram more particularly illustrating the measuring and display interface circuit in the system of FIG. 5.

FIGS. 1, 5, 6 illustrate one form of microcomputer apparatus which may be used for practicing the invention in accordance with the above-described method. FIGS. 1 and 5 schematically illustrate in block diagram form the overall apparatus; FIG. 6 illustrates a specific interface for measuring and display circuit that may be used; and FIG. 8 is a flow diagram illustrating one sequence of operation for which the microprocessor in FIG. 5 may be programmed to perform.

Thus, the apparatus illustrated in FIGS. 5–8 comprises a microcomputer, generally designated 20, including an ALU (Arithmetic Logic Unit) 22, a RAM (Random Access Memory) storage device 24, a ROM (Read Only Memory) storage device 26, and a timer 28. The ALU 22 communicates via input/output circuitry 29 with a measuring and display circuit 30. The latter circuit includes connectors 32 (FIG. 6) adapted to be connected to the terminals of the battery B under test, and a temperature sensor 34 for sensing the ambient (and battery) temperature.

As one example, the microcomputer 20 may be or include a Zilog Z-8 microcomputer, whose ports are connected to the measuring and display circuit 30 as shown in FIGS. 5 and 6.

With reference to FIG. 6, the measuring and display circuit 30 includes a voltage-to-frequency converter, generally designated 40, which produces an output frequency proportional to the voltage at its input terminals. The voltage-to-frequency converter, in conjunction with the timer-counter inside the controller (28 FIG. 5), functions as an analogue-to-digital converter to measure voltage. The basic frequency of circuit 40 is set by a fixed external capacitor $C_1$. As one example, circuit 40 may be voltage-to-frequency converter AD537. The latter converter also produces two output voltages, one voltage being a constant reference voltage and the other being a voltage in millivolts proportional to the absolute temperature. Thus, the converter (34 FIG. 6) also contains the temperature sensor (9 FIG. 1).

The measuring and display circuit 30 further includes a display comprising 7 LED's (Light Emitting Diodes) 42 driven by drivers 44 for displaying the determined residual capacity of the battery under test. The display panel further includes two additional LED's 46 to indicate "failure," in case the measured voltage of the battery under test is too low.

The measuring and display circuit 30 further includes five relays designated REL 0–4, driven by relay drivers 43 controlled by the microcomputer 20. The contacts of the five relays are connected, as shown in FIG. 6, to perform the following functions:

Relay REL-0 connects the voltage generated by the temperature sensor 34 (which voltage is proportional to the sensed temperature) to the measuring input of the voltage-to-frequency converter 40.

Relay REL-1 connects the reference voltage (e.g., one volt) to the measuring input of the voltage-to-frequency converter 40; relay REL-2 connects the voltage of the battery under test to the measuring input of the voltage-to-frequency converter 40, the latter voltage being fed from the connector terminal 32 via a voltage-divider circuit including resistors $R_2$ and one of the resistors $R_6$, $R_7$, $R_8$.

Relay REL-3 selectively powers either the remaining relays and the two "failure" indicator LED's 46, or the seven LED's 42 displaying the measured residual capacity of the battery under test.

Relay REL-4 connects and disconnects the load resistor $R_L$ across the battery under test, which elements correspond to resistor 4 and switch 6 in the diagram of FIG. 1.

FIG. 6 illustrates the connections of the various relays to the microcomputer 20, it being appreciated that each relay is enabled by a bit outputted by the microcomputer. Briefly, when relay REL-1 is energized, the reference voltage is connected to the voltage-to-frequency converter, and the reference frequency is measured. Since the reference voltage is known (e.g., one volt), the conversion factor of the voltage-to-frequency conversion is calculated by the microcomputer. When relay REL-0 is energized, the temperature is measured by measuring the frequency. Relay REL-0 is de-energized by lowering its bit. Relay REL-2 is energized to measure the voltage of the battery under test. In order to load the battery under test to produce the high discharge for a short period of time, relay REL-4 is energized, thereby connecting the load resistor $R_L$ (one of resistors $R_9$, $R_{10}$, $R_{11}$ respectively) across the battery. The "failure" LED's are energized whenever the measured voltage across the battery is out of the correct range.

FIG. 7 illustrates, for purposes of example, the front panel of a state-of-charge meter which could be used with the above-described apparatus, which meter includes indicator lamps for indicating the various states-of-charge as well as other pertinent information.

FIG. 8 is a flow-diagram illustrating the sequence of operations which the microcomputer 20 is programmed to perform:

Thus, the test is started by depressing the "go" button, whereupon an "ON"-indicator light 48 is energized, and then the reference voltage is measured so as to determine the conversion factor of the voltage-to-frequency converter 40; as indicated earlier, this is preferably one volt. The battery temperature, as sensed by temperature sensor 34, is then measured. Next, the open-circuit-voltage of the battery under test is measured and if it is found too high or too low, this is indicated by the "OCV failure" LED's 46 on the display panel, and further testing is terminated.

Next, the battery under test is loaded by connecting load resistor $R_L$ (by energizing relay REL-4) to produce a high discharge for a predetermined short period of time, preferably, for 60 seconds; this time period is determined by timer 28 (FIG. 5) of the microcomputer 20. After loading for 30 seconds, the voltage across the battery under test is again measured, and if it is found too low, the measurement is again terminated, and "load failure" LED 47 is energized. If the measured voltage is not too low, the loading of the battery is continued, to produce the high discharge for a total of 60 seconds (preferably), whereupon the load is disconnected (by de-energizing relay (REL-4). The battery under test recovers for 30 seconds, after which time the recovery open-circuit-voltage is measured. The measured recovery open-circuit-voltage and the previously-measured temperature, are then used to determine the residual capacity of the battery under test. As described earlier, this may be done by comparing these measurements with the reference values stored in look-up tables (e.g., in the microcomputer ROM 26) for the various temperatures with respect to the particular battery under test; alternatively, a close approximation of residual capacity can be computed by the computer 20, by solving Equation (3) above, for D-size $Li/SO_2$ batteries.

The residual capacity computed according to either of the above techniques is then displayed by LED's 42, while the "on" light is turned off, whereupon the system returns to the beginning of the above-described sequence of operations preparatory for the next test.

While the invention has been described with respect to one preferred embodiment, it will be appreciated that many other variations, modifications, and applications of the invention may be made.

What is claimed is:

1. The method of determining the state-of-charge of batteries, comprising the steps:
   (a) measuring the temperature of the battery;
   (b) loading the battery with a predetermined load to produce a high discharge for a short predetermined time;
   (c) after a short recovery time, measuring the recovered open-circuit-voltage and the corresponding recovery time of the battery; and
   (d) determining the state-of-charge of the battery from the measured temperature and measured recovery open-circuit-voltage for the predetermined load and loading time and the recovery time of the particular type battery.

2. The method according to claim 1, wherein said predetermined load in step (b) is such as would produce a discharge of full nominal capacity in 1–10 hours.

3. The method according to claim 2, wherein said predetermined load in step (b) is such as would produce a discharge of full nominal capacity in about 2–3 hours.

4. The method according to claim 1, wherein said predetermined loading time in step (b) is 1–300 seconds.

5. The method according to claim 4, wherein said predetermined loading time in step (b) is 10–60 seconds.

6. The method according to claim 1, wherein said recovery time before measuring the open-circuit-voltage in step (c) is 1–1000 seconds.

7. The method according to claim 6, wherein said recovery time is 10–60 seconds.

8. The method according to claim 1, wherein the state-of-charge of the battery is determined by comparing the measured temperature and recovery open circuit-voltage with reference tables showing the state-of-charge at different temperatures and recovery open-circuit-voltages for the respective battery, load, loading time and recovery time.

9. The method according to claim 1, wherein the battery is an $Li/SO_2$ or an $Li/SOCl_2$ battery.

10. The method according to claim 1, wherein the battery is a 9 Ah $Li/SO_2$ battery, the load is 0.5 ohm, the loading period is 60 seconds, the recovery time is 30 seconds, and the state-of-charge of the battery is determined by computing it from the measured temperature and recovery open-circuit-voltage according to the following equation:

$$\ln Q = 28.05[OCV_R + (T-25) \cdot 0.4 \cdot 10^{-3}] - 79.325$$

wherein:
Q is the residual charge in amp-hours;
ln Q is the natural log of Q;
$OCV_R$ is the measured-recovery open-circuit voltage divided by the number of cells in series, at temperature T;
T is the measured temperature.

11. Apparatus for determining the state-of-charge of betteries, comprising:
    (a) means for measuring the temperature of the battery;
    (b) means for loading the battery to produce a high predetermined discharge for a short predetermined time;
    (c) means effective, after a short recovery time, for measuring the recovered open-circuit-voltage and the corresponding recovery time of the battery; and
    (d) means for determining the state-of-charge of the battery from the measured temperature and the measured recovery open-circuit-voltage for the predetermined load and loading time and the recovery time of the particular type battery.

12. The apparatus according to claim 11, wherein said means (b) is effective to load the battery with a predetermined load such as would produce a discharge of full nominal capacity in 1-10 hours.

13. The apparatus according to claim 11, wherein said means (b) is effective to produce said predetermined high discharge for a recovery time of 1-300 seconds.

14. The apparatus according to claim 11, wherein said means (c) is effective to produce a predetermined recovery time of 1-1,000 seconds before measuring the recovery open-circuit-voltage.

15. The apparatus according to claim 11, wherein said means (d) includes means for storing reference tables showing the state-of-charge at different temperatures and recovery open-circuit-voltages for the respective battery, load, loading time and recovery time, and means for comparing same with the battery under test.

16. The apparatus according to claim 11, wherein the battery is an $Li/SO_2$ battery.

17. The apparatus according to claim 11, wherein the battery is a 9 Ah $Li/SO_2$ battery, and said means (d) includes means for computing the state-of-charge of the battery from the measured temperature and recovery open-circuit-voltage according to the following equation:

$$\ln Q = 28.05[OVC_R + (T-25) \cdot 0.4 \cdot 10^{-3}] - 79.325$$

wherein:
Q is the residual charge in amp-hours;
ln Q is the natural log of Q;
$OVC_R$ is the measured recovery open-circuit-voltage divided by the number of cells in series;
T is the measured temperature;
and wherein: the load is 0.5 ohm per cell, the loading period is 60 seconds, and the recovery time is 30 seconds.

18. Apparatus for determining the state-of-charge of a bettery, comprising: a temperature sensor for sensing the temperature of the battery; a load resistor for connection across the terminals of the battery for loading same with a predetermined load; measuring circuit means for measuring the temperature and also the battery voltage; a timer circuit; a display; and a control system effective:
    (a) to connect said temperature sensor to said measuring circuit for measuring the temperature of the battery;
    (b) to thereafter connect said load resistor across the terminals of the battery for loading same for a short time interval as predetermined by said timer circuit;
    (c) after a short recovery time as determined by said timer circuit, to connect the battery to said measuring means to measure the battery recovery open-circuit-voltage; and
    (d) to display a value corresponding to said measured recovery voltage on said display.

19. Apparatus according to claim 18, wherein said control system includes a microprocessor programmed to perform functions (a)-(d).

20. Apparatus according to claim 19, wherein said microprocessor further includes a storage device having stored therein reference tables of the residual state-of-charge at different temperatures and recovery open-circuit-voltages for the respective battery, and the predetermined load, loading time and recovery time.

21. Apparatus according to claim 19, particularly for use with 9 Ah $Li/SO_2$ batteries, wherein said microprocessor further includes means for computing the state-of-charge of the battery from the measured temperature and recovery open-circuit-voltage according to the following equation:

$$\ln Q = 28.05[OCV_R + (T-25) \cdot 0.4 \cdot 10^{-3}] - 79.325$$

wherein:
Q is the residual charge in amp-hours;
ln Q is the natural log of Q;
$OCV_R$ is the measured recovery open-circuit voltage divided by the number of cells in series at;
T is the measured temperature; and wherein: the load is 0.5 ohm per cell, the leading period is 60 seconds, and the recovery time is 30 seconds.

22. Apparatus according to claim 18, wherein said load resistor has a value such as it would produce a discharge of full nominal capacity in 1-10 hours.

23. Apparatus according to claim 18, wherein said load resistor has a value such as it would produce a discharge of full nominal capacity in about 2-3 hours.

24. Apparatus according to claim 18, wherein said microprocessor connects said load resistor across the battery terminals for a period of 1-300 seconds.

25. Apparatus according to claim 24, wherein said microprocessor connects said load resistor across the battery terminals for a period of 10-60 seconds.

26. Apparatus according to claim 18, wherein said microprocessor causes the battery recovery open-circuit-voltage to be measured after a recovery time of 1-1000 seconds following the loading thereof by the load resistor.

* * * * *